(12) United States Patent
Imai

(10) Patent No.: US 11,756,919 B2
(45) Date of Patent: Sep. 12, 2023

(54) WEDGE TOOL, BONDING DEVICE, AND BONDING INSPECTION METHOD

(71) Applicant: Mitsubishi Electric Corporation, Tokyo (JP)

(72) Inventor: Daisuke Imai, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 119 days.

(21) Appl. No.: 16/766,042

(22) PCT Filed: Feb. 7, 2018

(86) PCT No.: PCT/JP2018/004187
§ 371 (c)(1),
(2) Date: May 21, 2020

(87) PCT Pub. No.: WO2019/155547
PCT Pub. Date: Aug. 15, 2019

(65) Prior Publication Data
US 2020/0395333 A1    Dec. 17, 2020

(51) Int. Cl.
*H01L 23/00* (2006.01)
*H01L 21/50* (2006.01)
*H01L 21/60* (2006.01)

(52) U.S. Cl.
CPC .............. *H01L 24/78* (2013.01); *H01L 21/50* (2013.01); *H01L 24/48* (2013.01);
(Continued)

(58) Field of Classification Search
CPC ......... H01L 22/12; H01L 22/30; H01L 24/78; H01L 2224/48455; H01L 2224/78315; H01L 2224/7834; H01L 2224/859
See application file for complete search history.

(56) References Cited

U.S. PATENT DOCUMENTS 4,415,115 A * 11/1983 James ..................... H01L 24/85
228/180.5
4,776,509 A * 10/1988 Pitts ........................ H01L 24/78
228/179.1
(Continued)

FOREIGN PATENT DOCUMENTS

JP    S61-078128 A    4/1986
JP    H08-111445 A    4/1996
(Continued)

OTHER PUBLICATIONS

International Search Report issued in PCT/JP2018/004187; dated May 1, 2018.
(Continued)

*Primary Examiner* — David A Zarneke
(74) *Attorney, Agent, or Firm* — Studebaker & Brackett PC

(57) ABSTRACT

It is an object to enable a non-destructive inspection of reliability of a bonding part and enabling an accurate inspection. A wedge tool includes: a groove which is formed along a direction of an ultrasonic vibration in a tip portion and in which a bonding wire is disposed in a wedge bonding; a first planar surface and a second planar surface disposed on both sides of the groove; and at least one convex portion formed away from the groove in at least one of the first planar surface and the second planar surface, wherein the bonding wire comes in contact with the convex portion by a deformation of the bonding wire in a bonding part of the bonding wire and a bonded object bonded to each other by a wedge bonding.

10 Claims, 4 Drawing Sheets

(52) U.S. Cl.
CPC .............. *H01L 2021/60195* (2013.01); *H01L 2224/48455* (2013.01); *H01L 2224/78315* (2013.01); *H01L 2224/78343* (2013.01); *H01L 2224/859* (2013.01)

(56) References Cited

U.S. PATENT DOCUMENTS

| | | | | |
|---|---|---|---|---|
| 5,379,512 A * | 1/1995 | Ingle | .................. | H05K 3/388 29/843 |
| 5,421,503 A * | 6/1995 | Perlberg | .................. | H01L 24/85 228/180.5 |
| 5,816,480 A * | 10/1998 | Nakamura | .............. | H01L 24/78 219/56.22 |
| 5,871,141 A * | 2/1999 | Hadar | .................. | B23K 20/005 228/180.5 |
| 5,906,308 A * | 5/1999 | Yamazaki | ............... | H01L 24/85 228/55 |
| 5,931,368 A * | 8/1999 | Hadar | ..................... | H01L 24/78 228/4.5 |
| 6,041,995 A * | 3/2000 | Takahashi | ............ | B23K 20/007 228/5.1 |
| 6,065,676 A * | 5/2000 | Ring | .................. | G06K 7/10693 235/462.43 |
| 6,555,764 B1 * | 4/2003 | Maruyama | ............... | G01R 3/00 438/665 |
| 7,427,009 B2 * | 9/2008 | Lim | ........................ | H01L 24/78 228/110.1 |
| 8,143,155 B2 * | 3/2012 | Mii | ......................... | H01L 24/85 228/180.5 |
| 9,093,515 B2 * | 7/2015 | Uehling | ............... | B23K 20/007 |
| 9,209,147 B1 * | 12/2015 | Foong | .................... | H01L 24/13 |
| 9,458,629 B2 * | 10/2016 | Bauer | .................... | B29C 65/08 |
| 10,744,591 B2 * | 8/2020 | Miyashiro | .............. | H05K 3/328 |
| 2005/0218188 A1 * | 10/2005 | Lee | ...................... | B23K 20/005 228/4.5 |

FOREIGN PATENT DOCUMENTS

| | | |
|---|---|---|
| JP | 2000-299347 A | 10/2000 |
| JP | 2011-171676 A | 9/2011 |

OTHER PUBLICATIONS

An Office Action issued by the German Patent and Trade Mark Office dated Nov. 25, 2022, which corresponds to German Patent Application No. 112018007032.8 and is related to U.S. Appl. No. 16/766,042; with English language translation.

* cited by examiner

WEDGE TOOL, BONDING DEVICE, AND BONDING INSPECTION METHOD

TECHNICAL FIELD

A technique disclosed in a specification of the present application relates to a wire bonding technique.

BACKGROUND ART

A wire bonding includes two types of bonding of a ball bonding in which a thermos-sonic bonding is performed using a capillary tool and a wedge bonding in which an ultrasonic bonding is performed using a wedge tool.

A wire bonding device performing the wedge bonding includes a wedge tool body part, a wire cutter, a wire clamp, and a wire guide. The wedge tool body part is attached to the wire bonding device via an ultrasonic horn.

The wire bonding device described above forms a bonding wire made of aluminum or copper on a semiconductor device, for example, thereby forming an electrical connection (refer to Patent Document 1, for example).

Specifically, an ultrasonic vibration is applied to the bonding wire supplied to a lower side of the wedge tool through the wire guide while pressing the bonding wire on a bonded object with the wedge tool body part, thereby a process of bonding the bonding wire to the bonded object is repeated.

PRIOR ART DOCUMENTS

Patent Documents

Patent Document 1: Japanese Patent Application Laid-Open No. 8-111445

SUMMARY

Problem to be Solved by the Invention

In the wedge bonding, generally, a peel test and a shear test are used as methods of evaluating a bonding reliability of a bonded object and the bonding wire.

However, these methods are destruction inspections, so that a sample inspection can be performed but a total inspection cannot performed. Thus, used as a method of non-destructively inspecting a reliability of a bonding part is a method of measuring a deformation amount of a bonding wire in a direction perpendicular to a vibration direction of a tool using an apparatus such as a measuring microscope, a video analysis, or a laser displacement meter to determine the reliability of the bonding part (refer to Patent Document 1, for example).

Recently, a semiconductor device becomes increasingly small and dense. When the deformation amount of the bonding wire is measured, there is a case where all of bonding positions cannot be inspected by the measurement using the apparatus such as the measuring microscope, the video analysis, or the laser displacement meter by reason that an imaging is prevented by a wiring, a resin case, or an external input-output electrode, for example, which is bonded afterward.

There is also a method of performing a sensitive virtual inspection by comparing a limit sample indicting a limit of quality standards of a manufacture and an inspection object, however, this method often depends on a sense of an inspector or a degree of proficiency of an inspector, so that the inspection can hardly be performed with a high degree of accuracy.

A technique disclosed in the specification of the present application therefore has been made to solve the above problems, and it is an object to provide a technique capable of non-destructively inspecting a reliability of a bonding part and enabling an accurate inspection.

Means to Solve the Problem

A first aspect of a technique disclosed in the specification of the present application is a wedge tool performing a wedge bonding by an ultrasonic vibration, including: a groove which is formed along a direction of the ultrasonic vibration in a tip portion of the wedge tool and in which a bonding wire is disposed in a wedge bonding; a first planar surface and a second planar surface disposed on both sides of the groove on the tip portion of the wedge tool; and at least one convex portion formed away from the groove in at least one of the first planar surface and the second planar surface, wherein the bonding wire comes in contact with the convex portion by a deformation of the bonding wire in a bonding part of the bonding wire and a bonded object bonded to each other by a wedge bonding.

According to a second aspect of the technique disclosed in the specification of the present application, a wedge bonding of a semiconductor device is performed using the wedge tool described above.

A third aspect of the technique disclosed in the specification of the present application includes: a groove which is formed along a direction of the ultrasonic vibration in a tip portion of the wedge tool and in which a bonding wire is disposed in a wedge bonding; a first planar surface and a second planar surface disposed on both sides of the groove on the tip portion of the wedge tool; and at least one convex portion formed away from the groove in at least one of the first planar surface and the second planar surface, wherein a wedge bonding of a semiconductor device is performed using the wedge tool in which the bonding wire comes in contact with the convex portion by a deformation of the bonding wire in a bonding part of the bonding wire and a bonded object bonded to each other by a wedge bonding, and detected is a transfer mark generated by transferring the convex portion in the bonding part of the bonding wire and the bonded object formed by a wedge bonding.

Effects of the Invention

The first aspect of the technique disclosed in the specification of the present application is a wedge tool performing a wedge bonding by an ultrasonic vibration, including: a groove which is formed along a direction of the ultrasonic vibration in a tip portion of the wedge tool and in which a bonding wire is disposed in a wedge bonding; a first planar surface and a second planar surface disposed on both sides of the groove on the tip portion of the wedge tool; and at least one convex portion formed away from the groove in at least one of the first planar surface and the second planar surface, wherein the bonding wire comes in contact with the convex portion by a deformation of the bonding wire in a bonding part of the bonding wire and a bonded object bonded to each other by a wedge bonding. According to such a configuration, when the bonding wire comes in contact with the convex portion by the deformation of the bonding wire in the bonding part, the transfer mark is formed in the bonding part. When the transfer mark is formed, the width of the bonding part is sufficiently large, thus when the distance to the convex portion is the lower limit value, for example, it is recognized that the width of the bonding part for securing the reliability of the semiconductor device is secured. Accordingly, the transfer mark which is sufficiently small compared with the whole shape of the bonding part is used for the quality determination of the bonding part, thus the reliability of the bonding part can be non-destructively inspected, and the inspection can be performed with a high degree of accuracy.

According to the second aspect of the technique disclosed in the specification of the present application, a wedge bonding of a semiconductor device is performed using the wedge tool described above. According to such a configuration, when the bonding wire comes in contact with the convex portion by the deformation of the bonding wire in the bonding part, the transfer mark is formed in the bonding part. When the transfer mark is formed, the width of the bonding part is sufficiently large, thus when the distance to the convex portion is the lower limit value, for example, it is recognized that the width of the bonding part for securing the reliability of the semiconductor device is secured. Accordingly, the transfer mark which is sufficiently small compared with the whole shape of the bonding part is used for the quality determination of the bonding part, thus the reliability of the bonding part can be non-destructively inspected, and the inspection can be performed with a high degree of accuracy.

According to the third aspect of the technique disclosed in the specification of the present application, a wedge bonding of a semiconductor device is performed using the wedge tool described above, and detected is a transfer mark generated by transferring the convex portion in the bonding part of the bonding wire and the bonded object formed by a wedge bonding. According to such a configuration, when the bonding wire comes in contact with the convex portion by the deformation of the bonding wire in the bonding part, the transfer mark is formed in the bonding part, thus it can be determined, by detecting the transfer mark, whether or not the width of the bonding part for securing the reliability of the semiconductor device is secured. The transfer mark is sufficiently small compared with the whole shape of the bonding part, thus the freedom degree of the imaging angle for imaging the transfer mark can be kept high. Thus, the accuracy of the quality determination in the bonding part can be kept high.

These and other objects, features, aspects and advantages of the technique disclosed in the specification of the present application will become more apparent from the following detailed description of the specification of the present application when taken in conjunction with the accompanying drawings.

DESCRIPTION OF EMBODIMENT(S)

Figure 1:
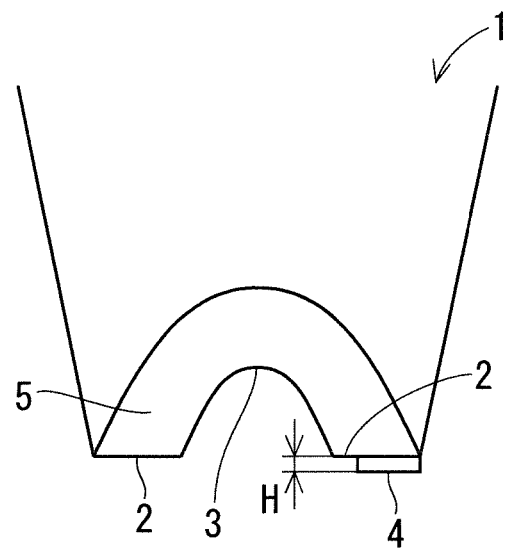
FIG. 1 A front view schematically illustrating an example of a configuration of a tip portion of a wedge tool according to an embodiment.

An embodiment is described hereinafter with reference to the appended drawings.

The drawings are schematically illustrated, and a configuration is appropriately omitted or simplified for convenience of explanation. A mutual relationship of sizes and positions of configurations illustrated in the different drawing is not necessarily accurately illustrated, but can be appropriately changed.

In the description hereinafter, the same reference numerals will be assigned to the similar constituent elements in the drawings, and the constituent elements having the same reference numeral have the same name and function. Accordingly, the detailed description on them may be omitted to avoid a repetition in some cases.

In the following description, even when terms indicating a specific position and direction such as "upper", "lower", "left", "right", "side", "bottom", "front" or "rear" are stated, the terms are used to facilitate understanding of embodiments for convenience, and therefore, irrelevant to directions in practical implementation.

Further, in the following description, even when ordinal numbers such as "first" or "second" are stated, the terms are used to facilitate understanding of embodiments, and therefore, the usage of the ordinal numbers does not limit the indication of the ordinal numbers to ordering.

First Embodiment

A wedge tool, a bonding device, and a bonding inspection method according to the present embodiment are described hereinafter. A wire bonding operation performed by a wire bonding device is firstly described for convenience of explanation.

Figure 7:
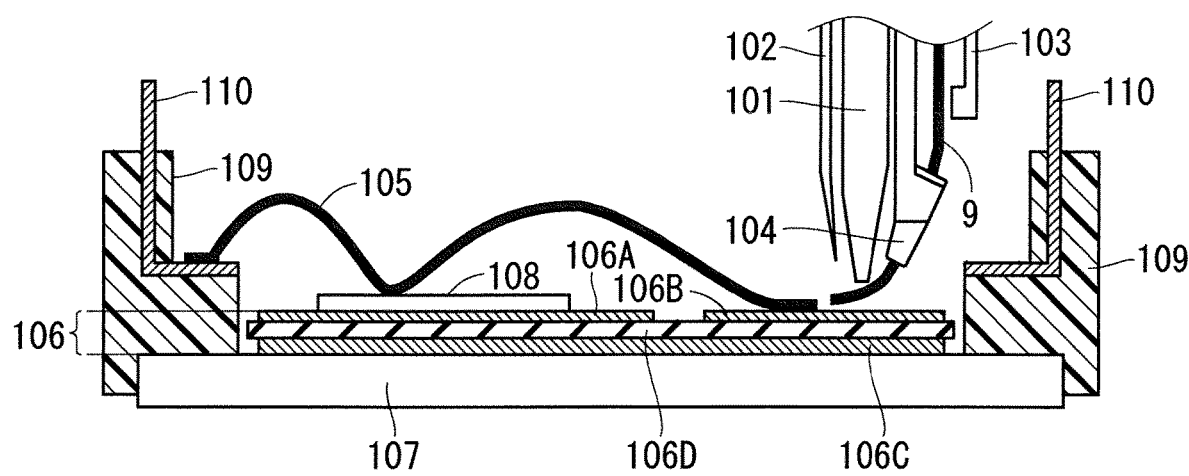
FIG. 7 A drawing for explaining an operation of performing a wire bonding on a semiconductor device using a wire bonding device.

FIG. 7 is a drawing for explaining an operation of performing a wire bonding on a semiconductor device using a wire bonding device.

The wire bonding device exemplified in FIG. 7 is a wire bonding device for performing a wedge bonding. As exemplified in FIG. 7, the wire bonding device includes a wedge tool 101, a wire cutter 102, a wire clamp 103, and a wire guard 104. The wedge tool 101 is attached to the wire bonding device via an ultrasonic horn.

FIG. 7 also illustrates an example of a configuration of a semiconductor device on which the wire bonding is performed. As exemplified in FIG. 7, the semiconductor device includes a radiation base 107, an insulating substrate 106 disposed on an upper surface of the radiation base 107, a semiconductor chip 108 disposed on an upper surface of the insulating substrate 106, a resin case 109 surrounding the insulating substrate 106 in a planar view and connected to the radiation base 107, and an external input-output electrode 110 attached to the resin case 109.

Therein, the insulating substrate 106 includes an insulating plate 106D, a conductive pattern 106A formed on an upper surface of the insulating plate 106D, a conductive pattern 106B formed on the upper surface of the insulating plate 106D, and a conductive pattern 106C formed on a lower surface of the insulating plate 106D. The conductive pattern 106A and the conductive pattern 106B are disposed to be separated from each other. The semiconductor chip 108 is disposed on an upper surface of the conductive pattern 106A via a solder, for example. The radiation base 107 is disposed on a lower surface of the conductive pattern 106C via a solder, for example.

A bonding wire 9 extending across the external input-output electrode 110, the semiconductor chip 108, and the conductive pattern 106B and made of aluminum or copper, for example, is formed on the semiconductor device having such a configuration, thereby electrically connecting these constituent elements.

Specifically, an ultrasonic vibration is applied to the bonding wire 9 supplied to a lower side of the wedge tool through the wire guide 104 while pressing the bonding wire 9 on a bonded object with the wedge tool 101, thereby a process of bonding the bonding wire 9 to the bonded object is repeated. A wiring 105 electrically connected can be formed by performing such a process.

<Configuration of Wedge Tool>

Figure 2:
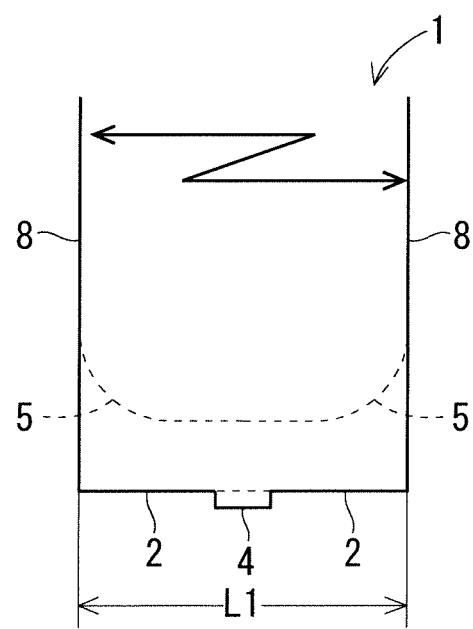
FIG. 2 A side view schematically illustrating an example of a configuration of the tip portion of the wedge tool according to the embodiment.
Figure 3:
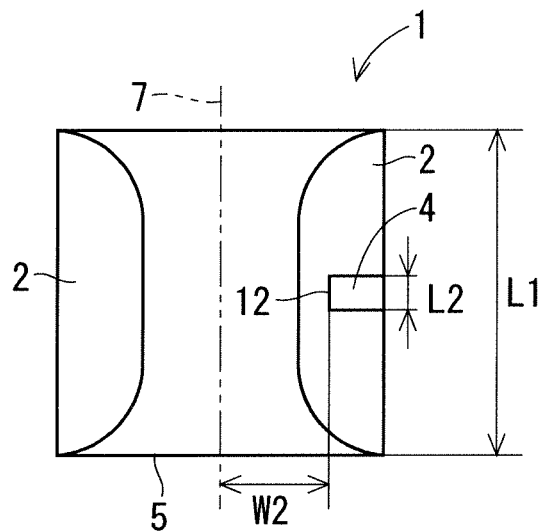
FIG. 3 A bottom view schematically illustrating an example of a configuration of the tip portion of the wedge tool according to the embodiment.

FIG. 1 is a front view schematically illustrating an example of a configuration of a tip portion of a wedge tool according to the present embodiment. FIG. 2 is a side view schematically illustrating an example of a configuration of the tip portion of the wedge tool according to the present embodiment. In FIG. 2, a vibration direction of the wedge tool is indicated by an arrow. FIG. 3 is a bottom view schematically illustrating an example of a configuration of the tip portion of the wedge tool according to the present embodiment.

As exemplified in FIG. 1, a groove 3, two planar surfaces 2 sandwiching the groove 3 from directions perpendicular to a direction in which the groove 3 is formed, and one or more convex portions 4 on at least one of the planar surfaces 2 are provided on a tip portion of a wedge tool 1.

A bottom surface and a side surface of the groove 3 are smoothly connected to each other in a cross section viewed from the direction in which the groove 3 is formed (that is to say, FIG. 1), and are formed by a curved surface 5 also having a curved surface shape in a cross section viewed from the direction perpendicular to the direction in which the groove 3 is formed (that is to say, FIG. 2). The bottom surface and the side surface of the groove 3 are smoothly connected to a side surface 8 of the wedge tool 1 in a cross section viewed from the direction perpendicular to the direction in which the groove 3 is formed (that is to say, FIG. 2). The bottom surface of the groove 3 is parallel to a bonding surface of the bonded object and the bonding wire.

As exemplified in FIG. 1, the two planar surfaces 2 are parallel to the bonding surface of the bonded object and the bonding wire. The two planar surfaces 2 are separately connected to the side surface 8 of the wedge tool 1.

As exemplified in FIG. 2, the convex portion 4 is located on a central part of the wedge tool 1 in the direction in which the groove 3 is formed (that is to say, the vibration direction of the wedge tool 1). A width of the wedge tool 1 in the direction in which the groove 3 is formed in the wedge tool 1 is indicated by a width L1.

As exemplified in FIG. 3, the convex portion 4 is formed to extend from an end portion of the planar surface 2 connected to the side surface 8 to a direction in which the groove 3 in the planar surface 2 is located in the direction perpendicular to the direction in which the groove 3 is formed.

An end portion of the convex portion 4 close to the groove 3 is a boundary 12 formed by a straight line or a curved line. The boundary 12 is provided in a position away from a central line 7 along the groove 3 in the wedge tool 1 by a distance W2 1.1 times or more larger than a radius R of the bonding wire.

A width L2 of the convex portion 4 in the direction in which the groove 3 is formed is equal to or larger than 1/20 of the radius R of the bonding wire. The convex portion 4 is formed to maintain the same width or increase the width from the boundary 12 toward the end portion connected to the side surface 8.

As exemplified in FIG. 1, a height H of the convex portion 4 at the boundary 12 is set in a range equal to or larger than 1/40 and equal to or smaller than 1/2 of the radius R of the bonding wire.

Figure 4:
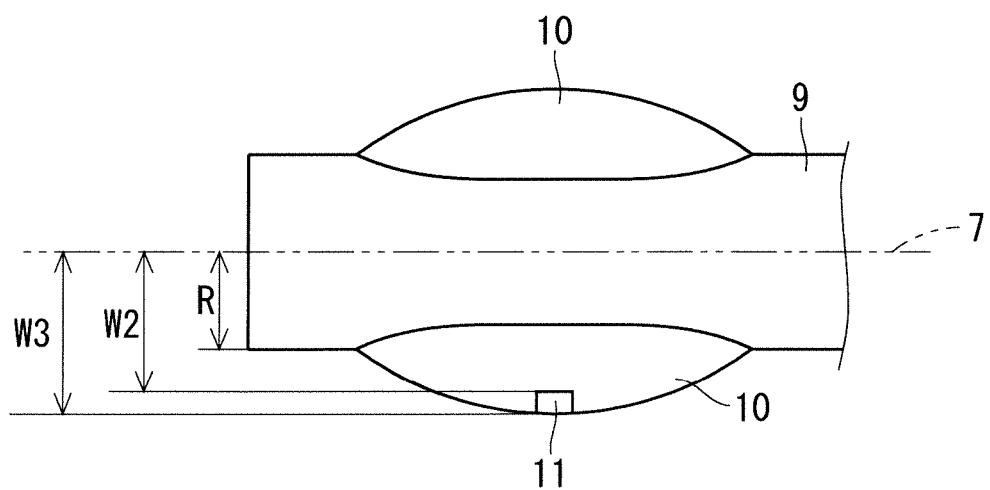
FIG. 4 A planar view illustrating an example of a bonding part on which an ultrasonic bonding is performed using a wedge tool and a shape of a convex portion is transferred according to the embodiment.

FIG. 4 is a planar view illustrating an example of a bonding part which an ultrasonic bonding is performed on using the wedge tool 1 according to the present embodiment and a shape of the convex portion 4 is transferred in. In FIG. 4, the bonding wire 9 and the bonded object are bonded, and the bonding part is formed. Fillets 10 located on both sides of the bonding wire 9 are formed by deforming the bonding wire 9. In FIG. 4, a transfer mark 11 is formed in the fillet 10 by pressing the convex portion 4 on the fillet 10 in the bonding.

A distance W2 from the central line 7 to the boundary 12 in the convex portion 4 in the wedge tool 1 according to the present embodiment is set to a lower limit width of the bonding part necessary to secure the reliability of the semiconductor device, for example. The central line 7 in the wedge tool 1 is disposed to coincide with a central line of the bonding wire 9.

At this time, a width from the central line 7 to an end portion of the bonding wire 9 in the bonding part which the ultrasonic bonding is performed on using the wedge tool 1 and the transfer mark 11 is formed in, that is to say, a crush width W3 which is half the width of the bonding part is larger than the distance W2, thus it can be recognized, by detecting the transfer mark 11, that the crush width of the bonding part for securing the reliability of the semiconductor device is larger than the lower limit width.

In the meanwhile, when the transfer mark 11 is not formed in the bonding part, it is recognized that the crush width of the bonding part is smaller than the lower limit value, thus the reliability of the bonding part and furthermore, the reliability of the semiconductor device is not secured.

The distance W2 from the central line 7 to the boundary 12 in the convex portion 4 in the wedge tool 1 according to the present embodiment is set to an upper limit width of the bonding part necessary to secure the reliability of the semiconductor device, for example. The central line 7 in the wedge tool 1 is disposed to coincide with the central line of the bonding wire 9.

At this time, the width W3 of the bonding part which the ultrasonic bonding is performed on using the wedge tool 1 and the transfer mark 11 is formed in is larger than the distance W2, thus it can be recognized that the crush width of the bonding part is larger than the upper limit width by detecting the transfer mark 11.

In the meanwhile, when the transfer mark 11 is not formed in the bonding part, it is recognized that the crush width of the bonding part is smaller than the upper limit value.

As described above, in the semiconductor device manufactured using the wedge tool 1 according to the present embodiment, the transfer mark 11 can be used as a quality determination mark in the bonding part.

Accordingly, it can be determined by a presence or absence of the transfer mark 11 whether or not the crush width of the bonding part is sufficient to secure the reliability of the semiconductor device, and the determination can be performed with a high degree of accuracy compared with a conventional case of performing a sensitive virtual inspection by a comparison with a limit sample.

The transfer mark 11 is sufficiently small compared with a whole shape of the bonding part. Thus, a freedom degree of an imaging angle for imaging the transfer mark 11 can be kept high even in a case where the imaging of the whole shape of the bonding part is prevented by the wiring 105, the resin case 109, or the external input-output electrode 110, for example. Thus, the accuracy of the quality determination in the bonding part can be kept high.

Second Embodiment

A wedge tool, a bonding device, and a bonding inspection method according to the present embodiment are described. In the following description, the same reference numerals are assigned to the similar constituent elements described in the embodiment described above, and the detailed description thereof will be appropriately omitted.

<Configuration of Wedge Tool>

Figure 5:
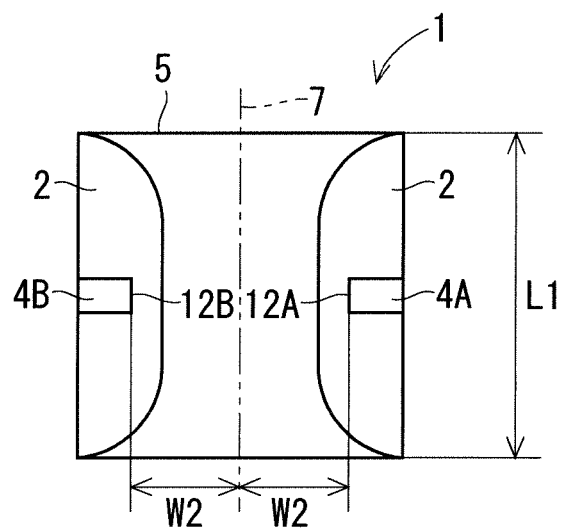
FIG. 5 A bottom view schematically illustrating an example of a configuration of the tip portion of the wedge tool according to the embodiment.

FIG. 5 is a bottom view schematically illustrating an example of a configuration of the tip portion of the wedge tool according to the present embodiment. In the configuration exemplified in FIG. 5, a convex portion 4A is formed in the planar surface 2 on a right side, and a convex portion 4B is formed in the planar surface 2 on a left side.

The convex portion 4A and the convex portion 4B are provided in positions symmetrical about the central line 7 of the wedge tool 1. A boundary 12A which is an end portion of the convex portion 4A close to the groove 3 is provided in a position away from the central line 7 of the wedge tool 1 by the distance W2. In the similar manner, a boundary 12B which is an end portion of the convex portion 4B close to the groove 3 is provided in a position away from the central line 7 of the wedge tool 1 by the distance W2.

According to such a configuration, a freedom degree of an imaging angle for imaging the convex portion 4A or the convex portion 4B can be increased compared with the case where the convex portion is provided only in one planar surface 2. Thus, the accuracy of the quality determination in the bonding part can be kept high.

Third Embodiment

A wedge tool, a bonding device, and a bonding inspection method according to the present embodiment are described. In the following description, the same reference numerals are assigned to the similar constituent elements described in the embodiment described above, and the detailed description thereof will be appropriately omitted.

<Configuration of Wedge Tool>

Figure 6:
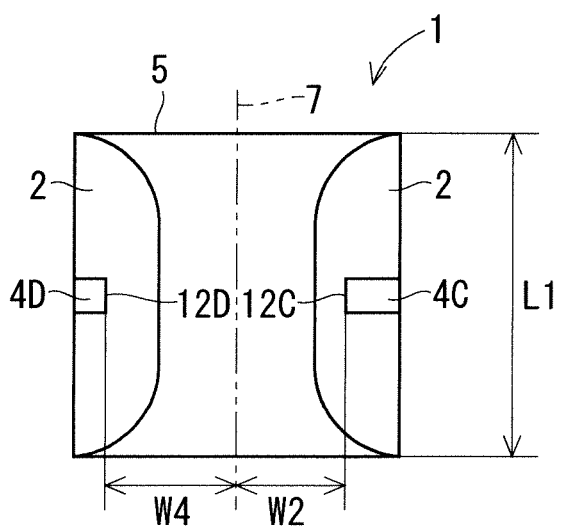
FIG. 6 A bottom view schematically illustrating an example of a configuration of the tip portion of the wedge tool according to the embodiment.

FIG. 6 is a bottom view schematically illustrating an example of a configuration of the tip portion of the wedge tool according to the present embodiment. In the configuration exemplified in FIG. 6, a convex portion 4C is formed in the planar surface 2 on a right side, and a convex portion 4D is formed in the planar surface 2 on a left side.

The convex portion 4C and the convex portion 4D are provided in positions asymmetrical about the central line 7 of the wedge tool 1. A boundary 12C which is an end portion of the convex portion 4C close to the groove 3 is provided in a position away from the central line 7 of the wedge tool 1 by the distance W2. In the meanwhile, a boundary 12D which is an end portion of the convex portion 4D close to the groove 3 is provided in a position away from the central line 7 of the wedge tool 1 by a distance W4.

Normally, a deformation width of the bonding wire in a direction perpendicular to a vibration direction of the wedge tool 1 extends to be substantially symmetrical about the central line 7 of the wedge tool 1.

Thus, in a case where the distance from the boundary 12C to the central line 7 is defined as the distance W2, a distance from the boundary 12D to the central line 7 is W4, and the distance W2 is smaller than the distance W4 in the convex portion 4C and the convex portion 4D provided to be asymmetrical about the central line 7, when no transfer mark 11 is formed, it is recognized that the crush width of the bonding wire 9 from the central line 7 is equal to or smaller than the distance W2. When one transfer mark 11 is formed, it is recognized that the crush width of the bonding wire 9 from the central line 7 is equal to or larger than the distance W2 and equal to or smaller than the distance W4. When the two transfer marks 11 are formed, it is recognized that the crush width of the bonding wire 9 from the central line 7 is equal to or larger than the distance W4, that is to say, a whole width of the bonding part of the bonding wire 9 is twice or larger than the distance W4.

Accordingly, for example, the distance W2 is set to the lower limit width of the bonding part necessary to secure the reliability of the semiconductor device, and the distance W4 is set to the upper limit width of the bonding part necessary to secure the reliability of the semiconductor device, thus it can be recognized that the crush width of the bonding part is within a standard range. Thus, the quality determination of the bonding part can be performed in more detail.

<Effect Caused by Embodiments Described Above>

An example of an effect caused by the embodiments described above is described next. It should be noted that, in the following description, the effects are described based on the specific configurations illustrated in the above described embodiments, however, other specific configurations may be applied in place of the configurations illustrated in the specification, within the scope of producing the similar effects.

Also, the replacement may be implemented with a plurality of embodiments. That is to say, each of the configurations illustrated in the corresponding embodiments may be combined with one another to produce the similar effects.

According to the embodiment described above, the wedge tool includes the groove 3, the first planar surface, the second planar surface, and at least one convex portion 4. Herein, each of the first planar surface and the second planar surface correspond to the planar surface 2, for example. The groove 3 is formed along the direction of ultrasonic vibration on the tip portion of the wedge tool 1. The bonding wire 9 is disposed in the groove 3 in the wedge bonding. The two planar surfaces 2 are disposed on both sides of the groove 3 on the tip portion of the wedge tool 1. The two planar surfaces 2 sandwich the groove 3 from the directions intersecting with the direction in which the groove 3 is formed. The convex portion 4 is formed away from the groove 3 in at least one of the two planar surfaces 2. The bonding wire 9 comes in contact with the convex portion 4 by the deformation of the bonding wire 9 in the bonding part of the bonding wire 9 and the bonded object bonded to each other by the wedge bonding. That is to say, the distance from the end portion of the convex portion 4 close to the groove 3 and the central line 7 of the groove 3 in a planar view is smaller than the half of the width of the bonding part of the bonding wire 9 and the bonded object bonded by the wedge bonding in the direction intersecting with the groove 3. Herein, the end portion of the convex portion 4 close to the groove 3 corresponds to the boundary 12, for example.

According to such a configuration, when the width of the bonding part from the central line 7 in the direction intersecting with the groove 3, that is to say, the crush width W3 of the bonding wire 9 is larger than the distance W2 between the boundary 12 of the convex portion 4 and the central line 7 of the groove 3, the convex portion 4 is pressed on the bonding wire 9 in the bonding part, more specifically, the fillet 10 formed of the bonding wire 9 deformed in the ultrasonic bonding, thus the transfer mark 11 is formed. When the transfer mark 11 is formed, the crush width W3 of the bonding part is larger than the distance W2, thus when the distance W2 is the lower limit value, for example, it is recognized that the crush width of the bonding part for securing the reliability of the semiconductor device is secured. Accordingly, the transfer mark 11 which is sufficiently small compared with the whole shape of the bonding part is used for the quality determination of the bonding part, thus the reliability of the bonding part can be non-destructively inspected, and the inspection can be performed with a high degree of accuracy.

The other configurations exemplified in the specification of the present application other than these configurations can be appropriately omitted. That is to say, when at least these configurations are included, the effect described above can be generated.

However, even when at least one of the other configurations exemplified in the specification of the present application is appropriately added to the configuration described above, that is to say, even when the other configurations exemplified in the specification of the present application but not mentioned as the configuration described above is appropriately added, the similar effect can be generated.

According to the embodiment described above, the bottom surface of the groove 3 is parallel to the two planar surfaces 2. According to such a configuration, the upper surface of the bonding wire 9 and the upper surface of the fillet 10 are parallelly formed by an ultrasonic bonding, and the bonding part having the high reliability can be formed.

According to the embodiment described above, the end portion of the groove 3 in the direction in which the groove 3 is formed has the curved surface shape, and is smoothly connected to the side surface of the wedge tool 1. According to such a configuration, the bonding wire 9 around the bonding part is supported by the curved surface shape, thus the bonding wire 9 and the bonded object can sufficiently have contact with each other in the bonding part.

According to the embodiment described above, the width of the convex portion 4 in the direction in which the groove 3 is formed is equal to or larger than 1/20 of the radius of the bonding wire 9 bonded by the wedge bonding. According to such a configuration, the width of the transfer mark 11 in the direction in which the groove 3 is formed can be set to the width which can be visually recognized easily.

According to the embodiment described above, the convex portion 4 is located in the central part of at least one of the two planar surfaces 2 in the direction in which the groove 3 is formed. According to such a configuration, the transfer mark 11 generated by transferring the convex portion 4 can be formed in the position where the crush width W3 of the bonding part expanding and deformed into the oval shape in a planar view in the direction intersecting with the direction in which the groove 3 is formed has the largest value.

According to the embodiment described above, the distance from the boundary 12 of the convex portion 4 to the central line 7 of the groove 3 is 1.1 times or more larger than the radius of the bonding wire 9 bonded by the wedge bonding. According to such a configuration, the transfer mark 11 generated by transferring the convex portion 4 can be formed when the crush width W3 of the bonding part is 1.1 times or more larger than the radius of the bonding wire 9.

According to the embodiment described above, the height of the convex portion 4 is equal to or larger than 1/40 and equal to or smaller than 1/2 of the radius of the bonding wire 9 bonded by the wedge bonding. According to such a configuration, the thickness of the bonding wire 9 in the bonding part blocks the convex portion 4 and the convex portion 4 does not have contact with the bonded object, thus damage to the bonded object by the convex portion 4 can be prevented.

According to the embodiment described above, the convex portion 4A is formed in one planar surface 2 and the convex portion 4B is formed in the other planar surface 2. The convex portion 4A and the convex portion 4B are located in the positions symmetrical about the central line 7 of the groove 3. According to such a configuration, the freedom degree of the imaging angle for imaging the convex portion 4A or the convex portion 4B can be increased compared with the case where the convex portion is provided only in one planar surface 2. Thus, the accuracy of the quality determination in the bonding part can be kept high. The reliability of the bonding part can be evaluated in detail in three stages of the case where the transfer mark 11 is formed in both fillets 10 extending to be substantially symmetrical about the central line 7, the case where the transfer mark 11 is formed in only one fillet 10, and the case where no transfer mark 11 is formed in both fillets 10, for example.

According to the embodiment described above, the convex portion 4C is formed in one planar surface 2 and the convex portion 4D is formed in the other planar surface 2. The distance from the boundary 12C of the convex portion 4C to the central line 7 of the groove 3 in a planar view is different from the distance from the boundary 12D of the convex portion 4D to the central line 7 of the groove 3 in a planar view. According to such a configuration, for example, the boundary 12C corresponds to the lower limit width of the bonding part necessary to secure the reliability of the semiconductor device, and the boundary 12D corresponds to the upper limit width of the bonding part necessary to secure the reliability of the semiconductor device, thus it can be recognized that the crush width of the bonding part is within the standard range. Thus, the quality determination of the bonding part can be performed in more detail.

According to the embodiment described above, the wedge bonding of the semiconductor device is performed using the wedge tool described above. According to such a configuration, the transfer mark 11 is formed in the bonding part when the crush width W3 of the bonding part is larger than the distance W2. When the transfer mark 11 is formed, the crush width W3 of the bonding part is larger than the distance W2, thus when the distance W2 is the lower limit value, for example, it is recognized that the crush width of the bonding part for securing the reliability of the semiconductor device is secured. Accordingly, the transfer mark 11 which is sufficiently small compared with the whole shape of the bonding part is used for the quality determination of the bonding part, thus the reliability of the bonding part can be non-destructively inspected, and the inspection can be performed with a high degree of accuracy.

According to the embodiment described above, the wedge bonding of the semiconductor device is performed using the wedge tool 1 described above in the bonding inspection method. The transfer mark 11 generated by transferring the convex portion 4 is detected in the bonding part of the bonding wire 9 and the bonded object formed by the wedge bonding.

According to such a configuration, the transfer mark 11 is formed in the bonding part when the crush width W3 of the bonding part is larger than the distance W2, thus it can be determined, by detecting the transfer mark 11, whether or not the crush width of the bonding part for securing the reliability of the semiconductor device is secured. The transfer mark 11 is sufficiently small compared with the whole shape of the bonding part, thus the freedom degree of the imaging angle for imaging the transfer mark 11 can be kept high. Thus, the accuracy of the quality determination in the bonding part can be kept high.

The other configuration exemplified in the specification of the present application other than these configurations can be appropriately omitted. That is to say, when at least these configurations are included, the effect described above can be generated.

However, even when at least one of the other configurations exemplified in the specification of the present application is appropriately added to the configuration described above, that is to say, even when the other configurations exemplified in the specification of the present application but not mentioned as the configuration described above is appropriately added, the similar effect can be generated.

An order of performing each processing can be changed as long as there is no particular limitation.

<Modification Example in Embodiments Described Above>

In the embodiments described above, material properties, materials, dimensions, shapes, relative arrangement relations, conditions for implementation, and so forth for the respective constituent elements may be described, however, these represent a mare example in all aspects, and are not limited to the description in the specification of the present application.

Accordingly, it is understood that numerous other modifications variations, and equivalents can be devised without departing from the scope of the technique disclosed in the specification of the present application. For example, the following cases where at least one of the constituent elements is to be modified, added, or omitted, further, at least one of the constituent elements of at least one of the embodiments is extracted and then combined with constituent elements of the other embodiment, are involved.

Each constituent element includes a structure having a different configuration or a different shape as long as the structure of the different configuration or the different shape achieves the same function.

What has been described in the specification of the present application is referred for all purposes regarding the present technique. It is thus not an admission that any of the descriptions provided herein are conventional techniques.

Further, in the embodiments described above, when names of materials are stated unless otherwise specified, an alloy of the material and other additives, and so forth are included, so far as consistent with the embodiments.

EXPLANATION OF REFERENCE SIGNS

1, 101 wedge tool, 2 planar surface, 3 groove, 4, 4A, 4B, 4C, 4D the convex portion, 5 curved surface, 7 central line, 8 side surface, 9 bonding wire, 10 fillet, 11 transfer mark, 12, 12A, 12B, 12C, 12D boundary, 102 wire cutter, 103 wire clamp, 104 wire guard, 105 wiring, 106 insulating substrate, 106A, 106B, 106C conductive pattern, 106D insulating plate, 107 radiation base, 108 semiconductor chip, 109 resin case, 110 external input-output electrode.

The invention claimed is:

1. A wedge tool performing a wedge bonding by an ultrasonic vibration, comprising:
    a groove which is formed along a direction of the ultrasonic vibration in a tip portion of the wedge tool and in which a bonding wire is disposed in a wedge bonding;
    a first planar surface and a second planar surface disposed on both sides of the groove on the tip portion of the wedge tool; and
    at least one convex portion formed away from the groove in at least one of the first planar surface and the second planar surface, wherein
    the bonding wire comes in contact with the convex portion by a deformation of the bonding wire in a bonding part of the bonding wire and a bonded object bonded to each other by a wedge bonding, and
    the convex portion is located in a central part of at least one of the first planar surface and the second planar surface in a direction in which the groove is formed.

2. The wedge tool according to claim 1, wherein
    a bottom surface of the groove is parallel to the first planar surface and the second planar surface.

3. The wedge tool according to claim 1, wherein
    an end portion of the groove in a direction in which the groove is formed has a curved surface shape, and is smoothly connected to a side surface of the wedge tool.

4. The wedge tool according to claim 1, wherein
    a width of the convex portion in a direction in which the groove is formed is equal to or larger than $\frac{1}{20}$ of a radius of the bonding wire bonded by a wedge bonding.

5. The wedge tool according to claim 1, wherein
    a distance from an end portion of the convex portion close to the groove to a central line of the groove is 1.1 times or more larger than a radius of the bonding wire bonded by a wedge bonding.

6. The wedge tool according to claim 1, wherein
    a height of the convex portion is equal to or larger than $\frac{1}{40}$ and equal to or smaller than $\frac{1}{2}$ of a radius of the bonding wire bonded by a wedge bonding.

7. The wedge tool according to claim 1, wherein
    the convex portions are formed in both the first planar surface and the second planar surface, and
    the convex portions are located in positions symmetrical about the central line of the groove.

8. A wedge tool performing a wedge bonding by an ultrasonic vibration, comprising:
    a groove which is formed along a direction of the ultrasonic vibration in a tip portion of the wedge tool and in which a bonding wire is disposed in a wedge bonding;
    a first planar surface and a second planar surface disposed on both sides of the groove on the tip portion of the wedge tool; and
    at least one convex portion formed away from the groove in at least one of the first planar surface and the second planar surface, wherein
    the bonding wire comes in contact with the convex portion by a deformation of the bonding wire in a bonding part of the bonding wire and a bonded object bonded to each other by a wedge bonding, the convex portions are formed in both the first planar surface and the second planar surface, and distances from the end portion of the convex portion close to the groove to the central line of the groove in a planar view are different from each other.

9. A bonding device, wherein a wedge bonding of a semiconductor device is performed using the wedge tool according to claim 1.

10. A bonding inspection method, comprising:

performing a wedge bonding of a semiconductor device using a wedge tool including: a groove which is formed along a direction of the ultrasonic vibration in a tip portion of the wedge tool and in which a bonding wire is disposed in a wedge bonding; a first planar surface and a second planar surface disposed on both sides of the groove on the tip portion of the wedge tool; and at least one convex portion formed away from the groove in at least one of the first planar surface and the second planar surface, wherein the bonding wire comes in contact with the convex portion by a deformation of the bonding wire in a bonding part of the bonding wire and a bonded object bonded to each other by a wedge bonding; and detecting a transfer mark generated by transferring the convex portion in the bonding part of the bonding wire and the bonded object formed by a wedge bonding.

\* \* \* \* \*